(12) United States Patent
Han (10) Patent No.: US 8,847,256 B2
(45) Date of Patent: Sep. 30, 2014

(54) LIGHT EMITTING DEVICE, LIGHT EMITTING DEVICE PACKAGE, AND LIGHTING SYSTEM

(75) Inventor: Sang Hoon Han, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 137 days.

(21) Appl. No.: 12/913,418

(22) Filed: Oct. 27, 2010

(65) Prior Publication Data

US 2011/0095323 A1 Apr. 28, 2011

(30) Foreign Application Priority Data

Oct. 28, 2009 (KR) .................. 10-2009-0102811

(51) Int. Cl.
| | | |
|---|---|---|
| H01L 33/00 | (2010.01) | |
| H01L 33/20 | (2010.01) | |
| H01L 33/46 | (2010.01) | |
| H01L 33/40 | (2010.01) | |
| H01L 33/22 | (2010.01) | |

(52) U.S. Cl.
CPC .............. *H01L 33/20* (2013.01); *H01L 33/46* (2013.01); *H01L 33/405* (2013.01); *H01L 33/0079* (2013.01); *H01L 33/007* (2013.01); *H01L 33/22* (2013.01)
USPC .............. 257/98; 257/E33.067; 257/E33.068; 257/E33.073; 257/E33.074

(58) Field of Classification Search
CPC ....................................................... H01L 33/60
USPC ............. 257/98, E33.067, E33.068, E33.073, 257/E33.074
See application file for complete search history.

(56) References Cited

U.S. PATENT DOCUMENTS

| | | | |
|---|---|---|---|
| 6,623,998 B2 | 9/2003 | Shibata et al. | |
| 7,723,732 B2 | 5/2010 | Tazima et al. | |
| 2004/0016936 A1 | 1/2004 | Tanaka et al. | |
| 2005/0156175 A1* | 7/2005 | Kim | 257/77 |
| 2006/0267025 A1 | 11/2006 | Wuu et al. | |
| 2006/0284205 A1 | 12/2006 | Liu | |
| 2007/0170840 A1 | 7/2007 | Chang-Hae et al. | |
| 2008/0029775 A1* | 2/2008 | Liu et al. | 257/98 |
| 2008/0128716 A1 | 6/2008 | Tazima et al. | |
| 2008/0251803 A1 | 10/2008 | Cho et al. | |
| 2009/0159917 A1* | 6/2009 | Jeong | 257/98 |
| 2010/0163906 A1 | 7/2010 | Hong et al. | |
| 2010/0295014 A1 | 11/2010 | Kang et al. | |

FOREIGN PATENT DOCUMENTS

| | | |
|---|---|---|
| CN | 1898357 A | 1/2007 |
| CN | 101197410 A | 6/2008 |
| EP | 1562238 A2 | 8/2005 |
| JP | 2008-117922 A | 5/2008 |
| KR | 10-2005-0075054 | 7/2005 |
| KR | 10-2009-0049065 A | 5/2009 |
| KR | 10-2010-0078778 A | 7/2010 |
| WO | WO 2008/082097 A1 | 7/2008 |
| WO | WO 2008082097 A1 * | 7/2008 |
| WO | WO 2009/002129 A2 | 12/2008 |
| WO | WO 2009002129 A2 * | 12/2008 |

* cited by examiner

*Primary Examiner* — Ha Tran T Nguyen
*Assistant Examiner* — Aaron Dehne
(74) *Attorney, Agent, or Firm* — McKenna Long & Aldridge LLP (57) ABSTRACT

Provided are a light emitting device, a light emitting device package, and a lighting system. The light emitting device comprises a first semiconductor layer comprising a plurality of vacant space parts, an active layer on the first semiconductor layer, and a second conductive type semiconductor layer on the active layer. Each of the plurality of air-lenses has a thickness less than that of the first semiconductor layer.

20 Claims, 10 Drawing Sheets

LIGHT EMITTING DEVICE, LIGHT EMITTING DEVICE PACKAGE, AND LIGHTING SYSTEM

CROSS-REFERENCE TO RELATED APPLICATIONS

The present application claims priority under 35 U.S.C. §119(a) of Korean Patent Application No. 10-2009-0102811 filed on Oct. 28, 2009, which is hereby incorporated by reference in its entirety.

BACKGROUND

Embodiments relate to a light emitting device, a light emitting device package, and a lighting system.

Light emitting diodes (LED) are semiconductor light emitting devices that convert current into light. As brightness of LEDs is gradually increased in recent years, the LEDs are being used as light sources for displays, vehicles, and illuminations. Also, LEDs emitting white light having superior efficiency may be realized by using a fluorescent substance or combining LEDs having various colors.

Brightness of such an LED depends on various conditions such as a light extraction structure, which can effectively extract light to the outside, a semiconductor material used in the LED, a chip size, and a kind of a molding member surrounding the LED.

SUMMARY

Embodiments provide a light emitting device having a new structure, a light emitting device package, and a lighting system. Embodiments also provide a light emitting device having an improved current spreading effect, a light emitting device package, and a lighting system. Embodiments also provide a light emitting device having improved light extraction efficiency, a light emitting device package, and a lighting system.

In one embodiment, a light emitting device comprises: a first semiconductor layer comprising a plurality of vacant space parts; an active layer on the first semiconductor layer; and a second conductive type semiconductor layer on the active layer, wherein each of the plurality of vacant space parts has a thickness less than that of the first semiconductor layer.

In another embodiment, a light emitting device package comprises: a body part; first and second electrode layers on the body part; and a light emitting device disposed on the body part and electrically connected to the first and second electrode layers, wherein the light emitting device comprises: a first semiconductor layer comprising a plurality of vacant space parts; an active layer on the first semiconductor layer; and a second conductive type semiconductor layer on the active layer, wherein each of the plurality of vacant space parts has a thickness less than that of the first semiconductor layer.

In further another embodiment, a lighting system comprises: a substrate; and a light emitting module comprising a light emitting device disposed on the substrate, wherein the light emitting device comprises: a first semiconductor layer comprising a plurality of vacant space parts; an active layer on the first semiconductor layer; and a second conductive type semiconductor layer on the active layer, wherein each of the plurality of vacant space parts has a thickness less than that of the first semiconductor layer.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device and a method of manufacturing the same according to embodiments will be described with reference to accompanying drawings.

First Embodiment

Figure 1:
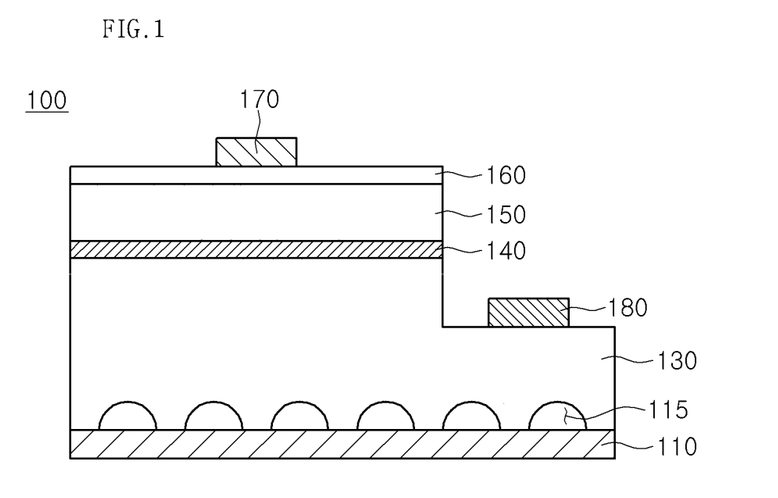
FIG. 1 is a sectional view of a light emitting device according to a first embodiment.

FIG. 1 is a sectional view of a light emitting device 100 according to a first embodiment.

Referring to FIG. 1, a light emitting device 100 includes a substrate 110, a plurality of air-lenses 115 formed by vacant space parts, a first semiconductor layer 130, an active layer 140, and a second conductive type semiconductor layer 150.

The substrate 110 may be formed of at least one of sapphire ($Al_2O_3$), SiC, Si, GaAs, GaN, ZnO, Si, GaP, InP, and Ge.

The plurality of air-lenses 115 may be disposed on the substrate 110. That is, lower ends of the plurality of air-lenses 115 may be disposed on the substrate 110.

A buffer layer (not shown) may be disposed on the substrate 110 to reduce a lattice constant difference between the substrate 110 and the first semiconductor layer 130. Here, the plurality of air-lenses 115 may be disposed on the buffer layer (not shown).

For example, each of the plurality of air-lenses 115 may have a convex lens shape. Alternatively, the air-lens may be variously changed in shape such as a hemisphere shape, a polygonal column shape, a polygonal pyramid shape, a cone shape, a truncated cone shape, and a polygonal cone shape.

Figure 2:
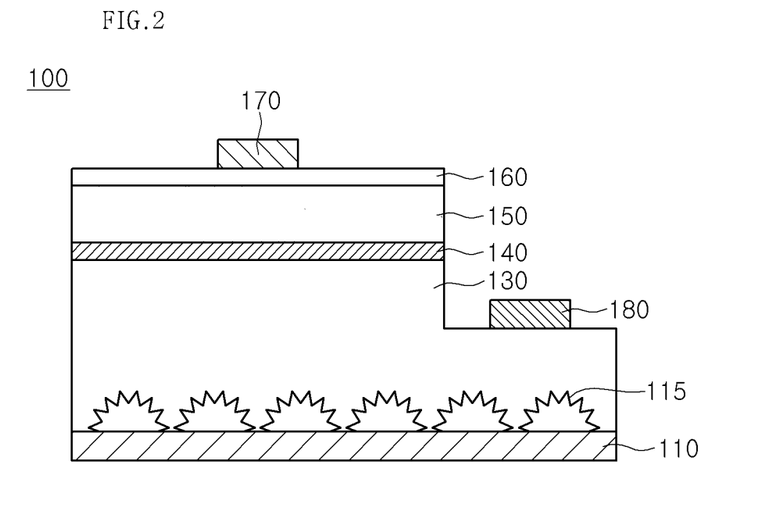
FIG. 2 is a sectional view illustrating a modified example of the light emitting device according to the first embodiment.

Also, referring to FIG. 2, a roughness may be disposed on a surface of each of the air-lenses 115 to improve light extraction efficiency of the light emitting device 100.

The plurality of air-lenses 115 may be filled with air and disposed on the entire surface on the substrate 110 or the buffer layer (not shown) or partially disposed on the substrate 110 or the buffer layer (not shown).

The first semiconductor layer 130 may be disposed on the substrate 110 and the plurality of air-lenses 115. That is, the plurality of air-lenses 115 may be disposed at an under surface of the first semiconductor layer 130. The plurality of air-lenses 115 is disposed within the first semiconductor layer 130. Also, each of the air-lenses 115 may have a thickness and area less than those of the first semiconductor layer 130 and may be formed by a space part, which is filled with the air.

The first semiconductor layer 130 may have a single-layered structure or a multi-layered structure. In case of the single-layered structure, the first semiconductor layer 130 may be realized by a first conductive type semiconductor layer. Also, in case of the multi-layered structure, the first semiconductor layer 130 may be realized by an undoped semiconductor layer, e.g., an undoped GaN layer, and the first conductive type semiconductor layer may be disposed on an upper layer of the multi-layered structure.

The first semiconductor layer 130 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., at least one of GaN, InN, AlN, InGaN, AlGaN, InAlGaN, and AlInN.

Also, when the first conductive type semiconductor layer is an n-type semiconductor layer, the first conductive type semiconductor layer may be doped with an n-type dopant such as Si, Ge, Sn, Se, and Te.

The first semiconductor layer 130 has a refractive index of about 2.12 to about 2.44, and each of the air-lenses 115 has a refractive index of about 1. Thus, light emitted from the active layer 140 to proceed toward the plurality of air-lenses 115 may be effectively and totally reflected onto a light emitting surface of the light emitting device 100 by a difference between the refractive indexes. Also, each of the plurality of air-lenses 115 may have a light scattering effect. Thus, the light extraction efficiency of the light emitting device 100 may be improved.

The active layer 140 is disposed on the first semiconductor layer 130. The active layer 140 may have at least one of a single quantum well structure, a multi quantum well (MQW) structure, a quantum wire structure, and a quantum dot structure.

A doped clad layer (not shown) in which an n-type or p-type dopant is doped may be disposed above/below the active layer 40. The clad layer (not shown) may be realized by an AlGaN layer or an InAlGaN layer.

The second conductive type semiconductor layer 150 is disposed on the active layer 140. For example, the second conductive type semiconductor layer 150 may be realized by a p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, AlInN, InGaN, AlN, or InN. Also, the p-type semiconductor layer may be doped with the p-type dopant such as Mg, Zn, Ca, Sr, and Ba.

The p-type dopant and the n-type dopant may be doped into the first conductive type semiconductor layer and the second conductive type semiconductor layer 150, respectively, but are not limited thereto. Also, although not shown, a third conductive type semiconductor layer (not shown) may be disposed on the second conductive type semiconductor layer 150. Thus, the light emitting device 100 may have one of a pn junction structure, an np junction structure, a pnp junction structure, and an npn junction structure.

A transparent electrode layer 160 may be disposed on the second conductive type semiconductor layer 150. The transparent electrode layer 160 may be formed of at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO, but is not limited thereto.

A second electrode 170 may be disposed on the transparent electrode layer 160, and a first electrode 180 may be disposed on the first semiconductor layer 130. The first and second electrodes 170 and 180 provide power to the light emitting device 100.

The first embodiment may provide the light emitting device 100 in which the plurality of air-lenses 115 is provided to improve the light extraction efficiency.

Figure 3:
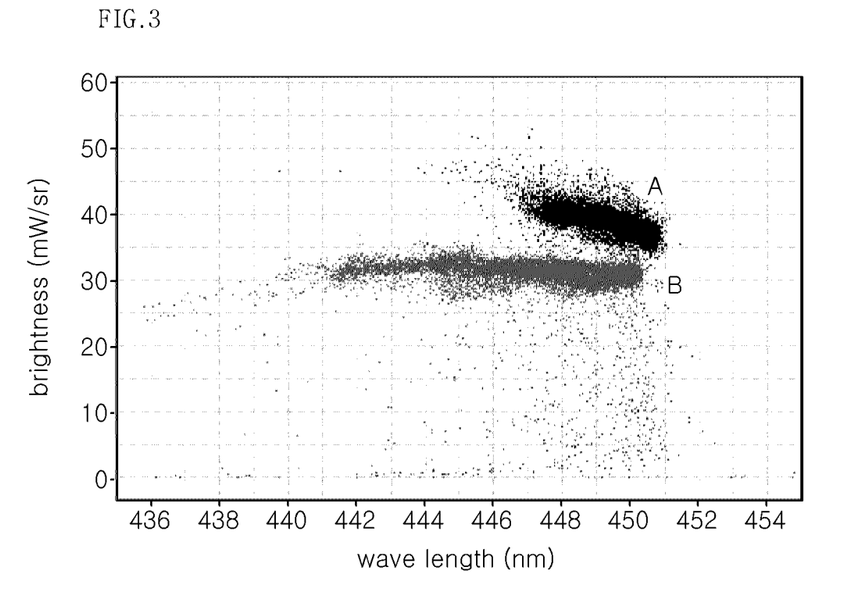
FIG. 3 is a graph illustrating a difference between brightness A of a light emitting device including an air-lens and brightness B of a light emitting device that does not include the air-lens.

FIG. 3 is a graph illustrating a difference between brightness A of the light emitting device 100 including the plurality of air-lenses 115 and brightness B of a light emitting device that does not include the plurality of air-lenses 115.

An x-axis of the graph represents a wavelength having a unit of nanometer (nm), and a y-axis of the graph represents light intensity having a unit of mW/sr.

According to the graph, it is seen that the brightness A of the light emitting device 100 including the plurality of air-lenses 115 is greater by about 25% to about 50% than that B of the light emitting device that does not include the plurality of air-lenses 115.

That is, the light extraction efficiency of the light emitting device 100 may be improved by the plurality of air-lenses 115.

Figure 4:
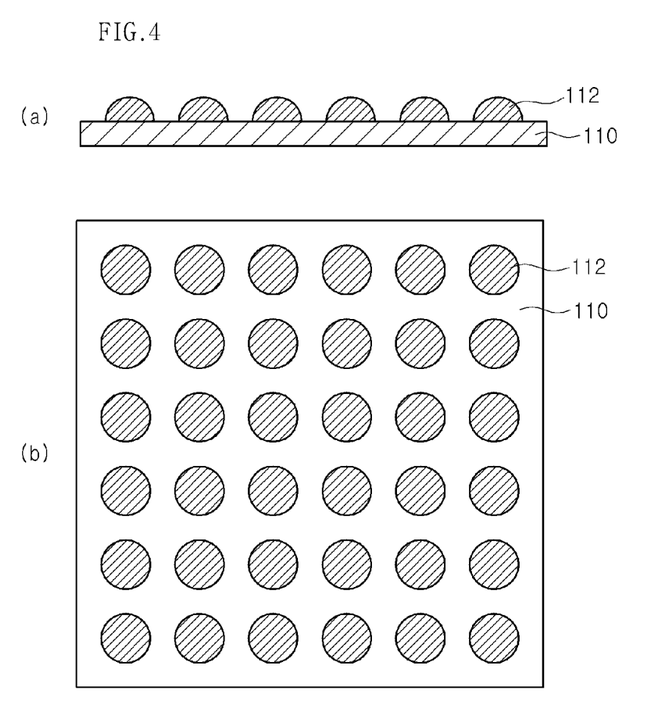
FIGS. 4 to 7 are views illustrating a method of manufacturing the light emitting device according to the first embodiment.
Figure 5:
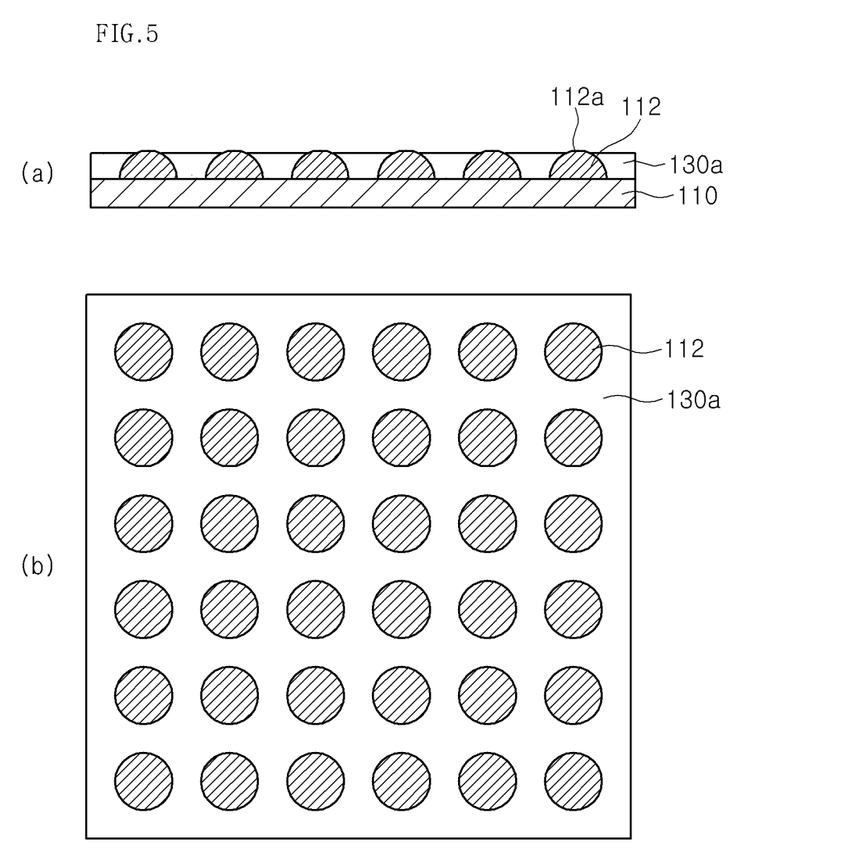
Figure 6:
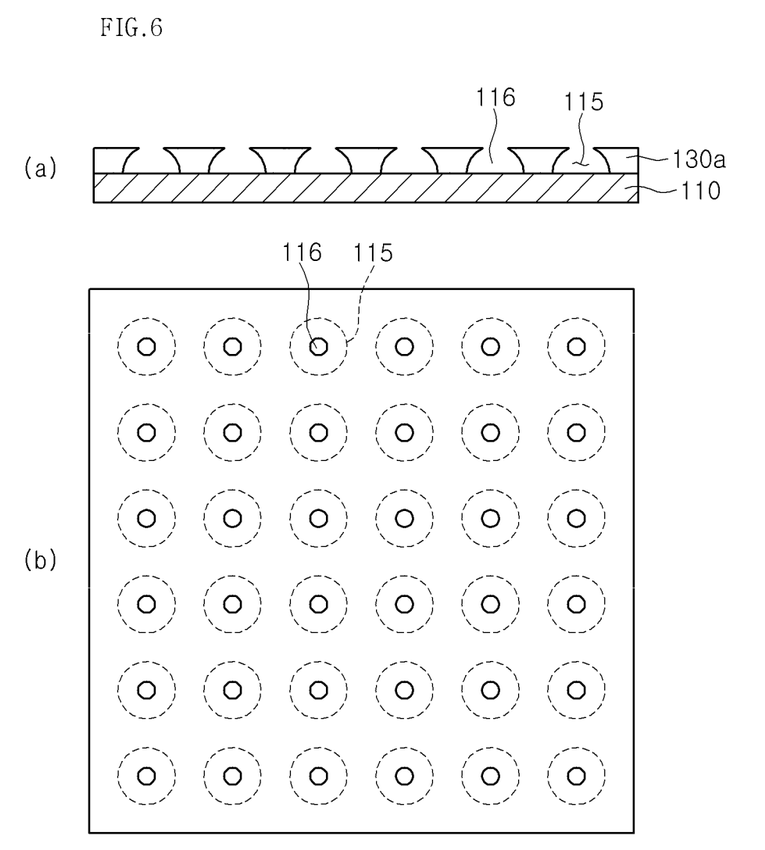

FIGS. 4 to 7 are views illustrating a method of manufacturing the light emitting device 100 according to the first embodiment. In FIGS. 4 to 6, (a) illustrates a sectional view, and (b) illustrates a plan view.

Referring to FIG. 4, a plurality of lens patterns 112 may be formed on a substrate 110.

A buffer layer (not shown) may be formed on the substrate 110. In this case, the plurality of lens patterns 112 may be formed on the buffer layer (not shown).

The substrate 110 may be formed of at least one of sapphire ($Al_2O_3$), SiC, Si, GaAs, GaN, ZnO, Si, GaP, InP, and Ge.

The plurality of lens pattern 112 may be formed of at least one of $SiO_2$, $SiO_x$, SiN, $SiN_x$, $SiO_xN_y$, GaO, ZnO, ITO, and W.

The plurality of lens patterns 112 may be formed on the substrate 110 through a lithography process such as a photolithography process, an E-beam lithography process, a laser hologram, or a deep UV stepper. Alternatively, a plasma-enhanced chemical vapor deposition (PECVD) or sputtering process may be performed to grow the lens patterns 112 on the substrate 110. However, the present disclosure is not limited thereto.

Although each of the plurality of lens patterns 112 has a convex lens shape in FIG. 4, the present disclosure is not limited thereto. For example, the lens pattern 112 may have a hemisphere shape, a polygonal column shape, a polygonal pyramid shape, a cone shape, a truncated cone shape, or a polygonal cone shape.

Also, a roughness may be formed on a surface of each of the plurality of lens patterns 112.

Referring to (b) of FIG. 4, the plurality of lens patterns 112 may be formed on the entire surface of the substrate 110 or partially formed on the substrate 110.

Also, the plurality of lens patterns 112 may be regularly disposed at a predetermined distance in row and column directions or irregularly disposed in the row and column directions.

Referring to (a) FIG. 5, a first semiconductor growth layer 130a may be formed on the substrate 110 to partially expose an upper portion 112a of each of the plurality of lens patterns 112.

The first semiconductor growth layer 130a may be grown to a height less than or equal to that of each of the plurality of lens patterns 112 to partially expose the upper portion 112a of each of the plurality of lens patterns 112. Here, the first semiconductor growth layer 130a may be grown to a thickness in which an air-lens (see reference numeral 115 of FIG. 6) is not lost or does not disappear in its shape when a second semiconductor growth layer (see reference numeral 130b of FIG. 7) is formed. That is, the upper portion 112a of the lens pattern 112 may be exposed to maintain the shape of the air-lens 115 after the first semiconductor growth layer 130a is grown as well as to easily remove the lens pattern 112.

Referring to FIG. 6, the plurality of lens patterns 112 may be removed to form the plurality of air-lenses 115.

An etch process may be performed on the plurality of lens patterns 112 through the exposed upper portion 112a of each of the plurality of lens patterns 112 to remove the plurality of lens patterns 112, thereby forming the plurality of air-lenses 115.

The etch process may be a wet etch process or a dry etch process. In case of the wet etch process, HF, KOH, $H_2SO_4$, $H_2O_2$, HCl, NaOH, $NH_4OH$, $HNO_3$, or BOE (Buffered Oxide Etchant) may be used as an etching solution. However, the present disclosure is not limited thereto.

The plurality of air-lenses 115 formed by removing the plurality of lens patterns 112 have opened upper portions 116, respectively. Thus, the plurality of lens patterns 112 etched through the opening upper portions 116 may be discharged in gas form.

Here, the plurality of lens patterns 112 may be completely removed by the etch process or partially removed to allow at least one portion of each of the plurality of lens patterns 112 to remain, but is not limited thereto.

Each of the plurality of air-lenses 115 may have the same shape as each of the plurality of lens patterns 112. For example, each of the plurality of air-lenses 115 may have various shapes such as a convex lens shape, a hemisphere shape, a polygonal column shape, a polygonal pyramid shape, a cone shape, a truncated cone shape, and a polygonal cone shape. The air-lens 115 may protrude toward an active layer, and a lower end of the air-lens 115 may be disposed on the substrate 110.

Also, as shown in FIG. 2, a roughness may be disposed on a surface of each of the air-lenses 115 to improve light extraction efficiency of the light emitting device 100.

The plurality of air-lenses 115 may be formed by a space part filled with air and disposed on the entire surface on the substrate 110 or the buffer layer (not shown) or partially disposed on the substrate 110 or the buffer layer (not shown).

Also, the plurality of air-lenses 115 may be regularly disposed at a predetermined distance in row and column directions or irregularly disposed in the row and column directions.

Figure 7:
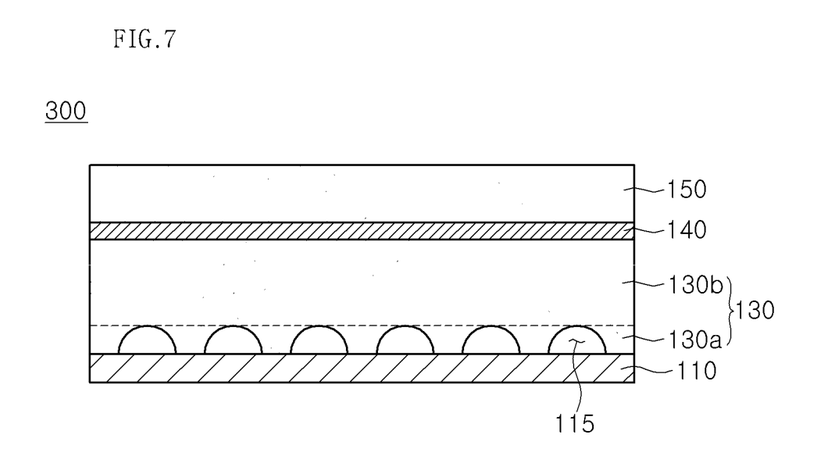

Referring to FIG. 7, a second semiconductor growth layer 130b may be formed on the first semiconductor growth layer 130a and the plurality of air-lenses 115.

The first semiconductor growth layer 130a and the second semiconductor growth layer 130b constitute the first semiconductor layer 130.

The first semiconductor layer 130 may have a single-layered structure or a multi-layered structure. In case of the single-layered structure, the first semiconductor layer 130 may be realized by a first conductive type semiconductor layer. Also, in case of the multi-layered structure, the first semiconductor layer 130 may be realized by an undoped semiconductor layer, e.g., an undoped GaN layer, and the first conductive type semiconductor layer may be formed on an upper layer of the multi-layered structure.

That is, the first and second semiconductor growth layers 130a and 130b may include at least one of the first conductive type semiconductor layer and the undoped semiconductor layer.

The first semiconductor layer 130 may be formed of a semiconductor material having a compositional formula of $In_xAl_yGa_{1-x-y}N$ ($0 \le x \le 1$, $0 \le y \le 1$, $0 \le x+y \le 1$), e.g., at least one of GaN, InN, AlN, InGaN, AlGaN, InAlGaN, and AlInN.

Also, when the first conductive type semiconductor layer is an n-type semiconductor layer, the first conductive type semiconductor layer may be doped with an n-type dopant such as Si, Ge, Sn, Se, and Te.

The first semiconductor layer 130 has a refractive index of about 2.12 to about 2.44, and each of the air-lenses 115 has a refractive index of about 1. Thus, light emitted from the active layer 140 to proceed toward the plurality of air-lenses 115 may be effectively and totally reflected onto a light emitting surface of the light emitting device 100 by a difference between the refractive indexes. Also, each of the plurality of air-lenses 115 may have a light scattering effect. Thus, the light extraction efficiency of the light emitting device 100 may be improved.

The active layer 140 is disposed on the first semiconductor layer 130. The active layer 140 may have at least one of a single quantum well structure, a multi quantum well (MQW) structure, a quantum wire structure, and a quantum dot structure.

A doped clad layer (not shown) in which an n-type or p-type dopant is doped may be disposed above/below the active layer 40. The clad layer (not shown) may be realized by an AlGaN layer or an InAlGaN layer.

The second conductive type semiconductor layer 150 is disposed on the active layer 140. For example, the second conductive type semiconductor layer 150 may be realized by a p-type semiconductor layer. The p-type semiconductor layer may be formed of a semiconductor material having a compositional formula of $In_xAl_yGa_{1-x-y}N$ ($0 \le x \le 1$, $0 \le y \le 1$, $0 \le x+y \le 1$), e.g., InAlGaN, GaN, AlGaN, AlInN, InGaN, AlN, InN, or AlInN. Also, the p-type semiconductor layer may be doped with the p-type dopant such as Mg, Zn, Ca, Sr, and Ba.

The p-type dopant and the n-type dopant may be doped into the first conductive type semiconductor layer and the second conductive type semiconductor layer 150, respectively, but are not limited thereto. Also, although not shown, a third conductive type semiconductor layer (not shown) may be disposed on the second conductive type semiconductor layer 150. Thus, the light emitting device 100 may have one of a pn junction structure, an np junction structure, a pnp junction structure, and an npn junction structure.

The first semiconductor layer 130, the active layer 140, and the second conductive type semiconductor layer 150 may be formed using a method such as a metal organic chemical vapor deposition (MOCVD) method, a chemical vapor deposition (CVD) method, a plasma-enhanced chemical vapor deposition (PECVD), a molecular beam epitaxy (MBE) method, or a hydride vapor phase epitaxy (HVPE) method.

A transparent electrode layer 160 may be disposed on the second conductive type semiconductor layer 150. The transparent electrode layer 160 may be formed of at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO, but is not limited thereto.

A reflective electrode layer may be formed on the second conductive type semiconductor layer 150. The reflective electrode layer may be formed of at least one of silver (Ag), an alloy containing Ag, aluminum (Al), or an alloy containing Al, which has high reflective index.

A second electrode 170 may be formed on the transparent electrode layer 160, and a first electrode 180 may be formed on the first semiconductor layer 130. A mesa-etching process may be performed on the light emitting device 100 to expose the first semiconductor layer 130, thereby forming the first electrode 180.

Here, the second electrode 170 may be formed on the second conductive type semiconductor layer 150 without forming the transparent electrode layer, but is not limited thereto.

The first and second electrodes 170 and 180 provide power to the light emitting device 100.

Second Embodiment

Hereinafter, a light emitting device 200 and a method of manufacturing the same according to a second embodiment will be described in detail. In descriptions of the second embodiment, the same part as that of the first embodiment will be described with reference to the first embodiment, and their duplicated descriptions will be omitted.

Figure 8:
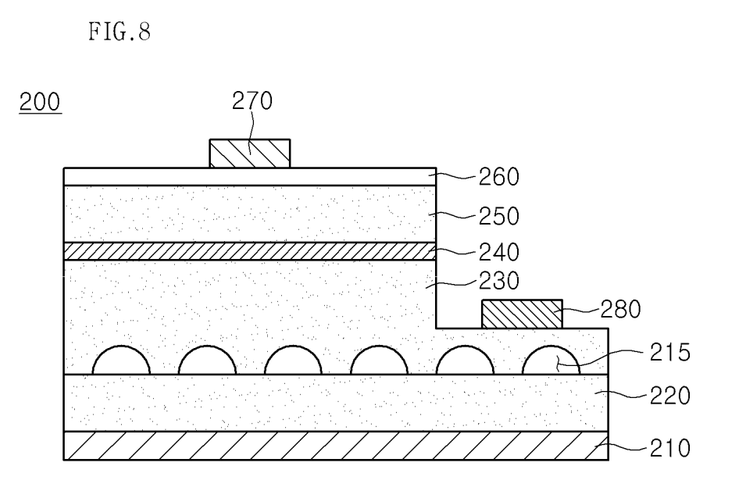
FIG. 8 is a sectional view of a light emitting device according to a second embodiment.

FIG. 8 is a sectional view of a light emitting device 200 according to a second embodiment.

Referring to FIG. 8, the light emitting device 200 includes an undoped semiconductor layer 220, a plurality of air-lenses 215, a first conductive type semiconductor layer 230, an active layer 240, and a second conductive type semiconductor layer 250.

The undoped semiconductor layer 220 may be disposed on the substrate 210. The undoped semiconductor layer 220 may be a semiconductor layer having conductivity significantly lower than those of the first and second conductive type semiconductor layers 230 and 250. For example, the undoped semiconductor layer 220 may be an undoped GaN layer.

A buffer layer (not shown) may be inserted between the substrate 210 and the undoped semiconductor layer 220. The buffer layer (not shown) is a layer for reducing a lattice constant difference between the substrate 210 and the undoped semiconductor layer 220. The buffer layer may be formed of one of GaN, AlN, AlGaN, InGaN, and AlInGaN.

The plurality of air-lenses 215 may be disposed on the undoped semiconductor layer 220.

For example, each of the plurality of air-lenses 215 may have a convex lens shape. Alternatively, the air-lens may be variously changed in shape such as a hemisphere shape, a polygonal column shape, a polygonal pyramid shape, a cone shape, a truncated cone shape, and a polygonal cone shape. Also, a roughness may be disposed on a surface of each of plurality of air-lenses 215. The air-lens 215 may protrude toward an active layer 240, and a lower end of the air-lens 215 may be disposed on the undoped semiconductor layer 220.

The plurality of air-lenses 215 may be filled with air and disposed on the entire surface on the undoped semiconductor layer 220 or partially disposed on the undoped semiconductor layer 220.

The first conductive type semiconductor layer 230 may be disposed on the undoped semiconductor layer 220 and the plurality of air-lenses 215. The undoped semiconductor layer 220 and the first conductive type semiconductor layer 230 constitute the first semiconductor layer.

The first conductive type semiconductor layer 230 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., at least one of GaN, InN, AlN, InGaN, AlGaN, InAlGaN, and AlInN.

Also, when the first conductive type semiconductor layer 230 is an n-type semiconductor layer, the first conductive type semiconductor layer 230 may be doped with an n-type dopant such as Si, Ge, Sn, Se, and Te.

The first semiconductor layer 230 has a refractive index of about 2.12 to about 2.44, and each of the air-lenses 215 has a refractive index of about 1. Thus, light emitted from the active layer 240 to proceed toward the plurality of air-lenses 215 may be effectively and totally reflected onto a light emitting surface of the light emitting device 200 by a difference between the refractive indexes. Also, each of the plurality of air-lenses 215 may have a light scattering effect. Thus, the light extraction efficiency of the light emitting device 200 may be improved.

Third Embodiment

Hereinafter, a light emitting device 200B and a method of manufacturing the same according to a third embodiment will be described in detail. In descriptions of the third embodiment, the same part as that of the second embodiment will be described with reference to the second embodiment, and their duplicated descriptions will be omitted.

Figure 9:
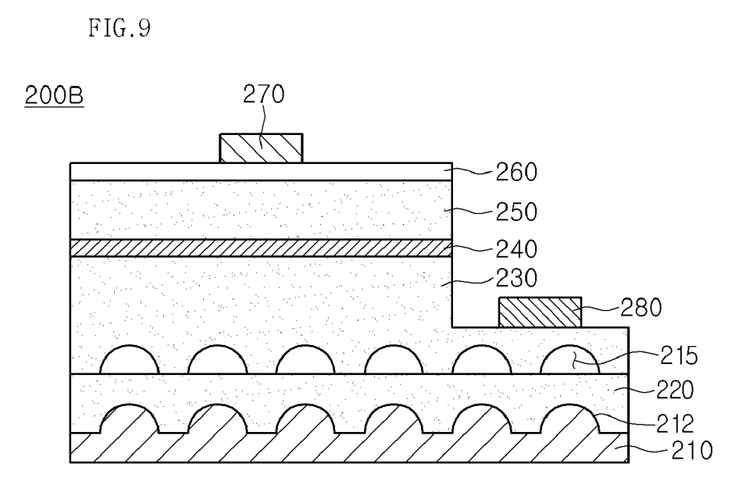
FIG. 9 is a sectional view of a light emitting device according to a third embodiment.

FIG. 9 is a sectional view of a light emitting device 200B according to a third embodiment.

Referring to FIG. 9, the light emitting device 200B includes a substrate 210 including roughness patterns 212, an undoped semiconductor layer 220, a plurality of air-lenses 215, a first conductive type semiconductor layer 230, an active layer 240, and a second conductive type semiconductor layer 250.

The substrate 210 may be formed of at least one of sapphire ($Al_2O_3$), SiC, Si, GaAs, GaN, ZnO, Si, GaP, InP, and Ge.

The roughness patterns 212 may be formed by etching the substrate 210.

Alternatively, SiO2, SiOx, SiN, SiNx, SiOxNy, GaO, ZnO, ITO, or W may be grown on the substrate 210 to form the roughness patterns 212.

The undoped semiconductor layer 220 may be disposed on the substrate 210. For example, the undoped semiconductor layer 220 may be an undoped GaN layer.

A buffer layer (not shown) may be inserted between the substrate 210 and the undoped semiconductor layer 220.

The plurality of air-lenses 215 may be disposed on the undoped semiconductor layer 220.

The first conductive type semiconductor layer 230 may be disposed on the undoped semiconductor layer 220 and the plurality of air-lenses 215.

The first conductive type semiconductor layer 230 has a refractive index of about 2.12 to about 2.44, and each of the air-lenses 215 has a refractive index of about 1. Thus, since a critical angle of light emitted from the active layer 240 to proceed toward the plurality of air-lenses 215 is reduced by the refractive index difference, an amount of light totally reflected onto a light emitting surface of the light emitting device 200B is increased by the plurality of air-lenses 215.

Also, since the substrate 210 includes the roughness patterns 212, light incident onto the substrate 210 may be effectively reflected onto the light emitting surface of the light emitting device 200B.

That is, light extraction efficiency of the light emitting device 200B may be improved by the plurality of air-lenses 215 and the roughness patterns 212.

Fourth Embodiment

Hereinafter, a light emitting device 300 and a method of manufacturing the same according to a fourth embodiment will be described in detail. In descriptions of the fourth embodiment, the same part as that of the first embodiment will be described with reference to the first embodiment, and their duplicated descriptions will be omitted.

Figure 10:
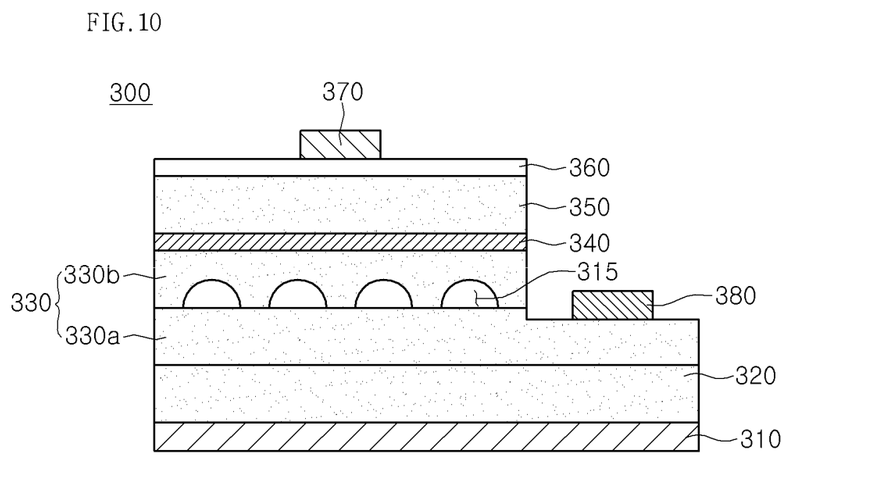
FIG. 10 is a sectional view of a light emitting device according to a fourth embodiment.

FIG. 10 is a sectional view of a light emitting device 300 according to a fourth embodiment.

Referring to FIG. 10, the light emitting device 300 includes an undoped semiconductor layer 320, a plurality of air-lenses 315, a first conductive type semiconductor layer 330, an active layer 340, a second conductive type semiconductor layer 350.

The substrate 310 may be formed of at least one of sapphire ($Al_2O_3$), SiC, Si, GaAs, GaN, ZnO, Si, GaP, InP, and Ge.

The undoped semiconductor layer 320 may be disposed on the substrate 310. For example, the undoped semiconductor layer 320 may be an undoped GaN layer.

A buffer layer (not shown) may be inserted between the substrate 310 and the undoped semiconductor layer 320.

The first conductive type semiconductor layer 330 may be disposed on the undoped semiconductor layer 320. The undoped semiconductor layer 320 and the first conductive type semiconductor layer 330 constitute a first semiconductor layer.

The first conductive type semiconductor layer 330 may include a first layer 330a and a second layer 330b.

The plurality of air-lenses 315 may be disposed between the first layer 330a and the second layer 330b of the first conductive type semiconductor layer.

The first conductive type semiconductor layer 330 has a refractive index of about 2.12 to about 2.44, and each of the air-lenses 315 has a refractive index of about 1. Thus, light emitted from the active layer 340 to proceed toward the plurality of air-lenses 315 may be effectively and totally reflected onto a light emitting surface of the light emitting device 300 by a difference between the refractive indexes. Also, each of the plurality of air-lenses 315 may have a light scattering effect. Thus, the light extraction efficiency of the light emitting device 300 may be improved.

Figure 11:
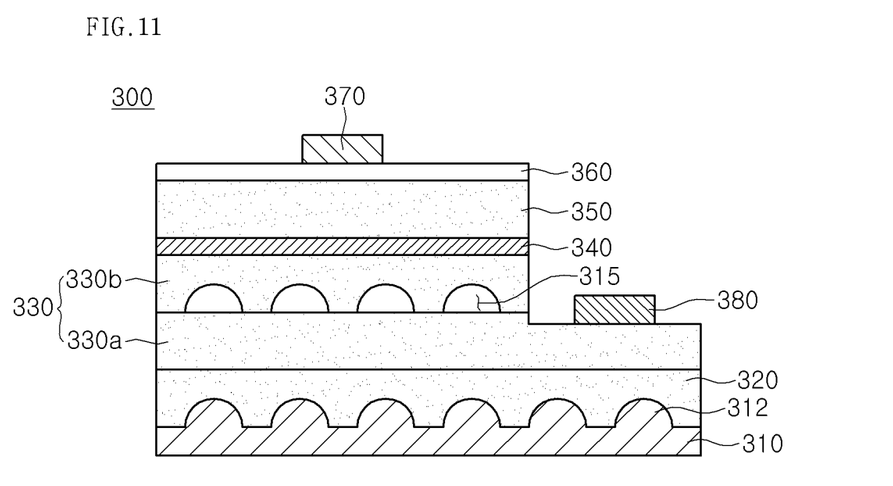
FIG. 11 is a sectional view illustrating a modified example of the light emitting device according to the fourth embodiment.

Referring to FIG. 11, roughness 312 may be disposed on the substrate 310, like the third embodiment. Since the substrate 310 includes the roughness patterns 312, light incident onto the substrate 310 may be effectively reflected onto a light emitting surface of the light emitting device 300. Thus, light extraction efficiency of the light emitting device 300 may be improved.

Fifth Embodiment

Hereinafter, a light emitting device 400 and a method of manufacturing the same according to a fifth embodiment will be described in detail. In descriptions of the fifth embodiment, the same part as that of the first embodiment will be described with reference to the first embodiment, and their duplicated descriptions will be omitted.

Figure 12:
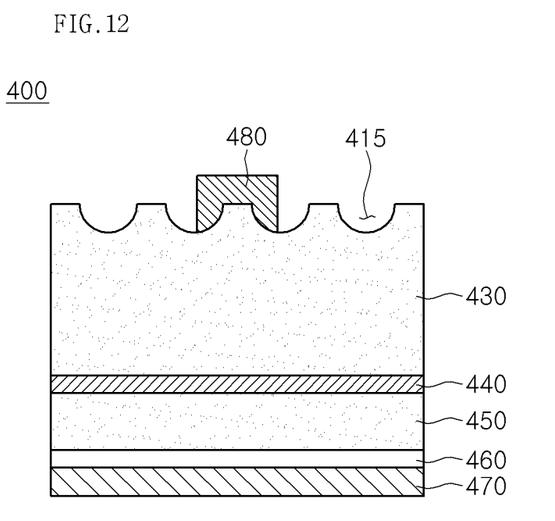
FIG. 12 is a sectional view of a light emitting device according to a fifth embodiment.

FIG. 12 is a sectional view of a light emitting device 400 according to a fifth embodiment.

Referring to FIG. 12, the light emitting device 400 includes a first semiconductor layer 430 including patterns 415 on a top surface thereof, an active layer 440, a second conductive type semiconductor layer 450, a reflective layer 460, a conductive support member 470, and a first electrode 480.

The reflective layer 460 may be formed on the second conductive type semiconductor layer 450 as shown in FIG. 7 of the first embodiment and the conductive support member 470 may be formed on the reflective layer 460 to remove the substrate using a laser lift off (LLO) process, thereby forming the light emitting device 400. Thus, the light emitting device 400 may be defined as a vertical type light emitting device. Here, FIG. 12 illustrates a view that turns the view of FIG. 7 upside down.

The plurality of air-lenses 115 according to the first embodiment is exposed by removing the substrate to form the patterns 415.

A polishing process using an ICP/RIE (inductively coupled plasma/reactive ion etching) manner may be performed on an under surface of the first semiconductor layer 430 after the substrate is removed. In this case, a portion of each of the patterns 415 may be removed or changed in shape.

An amount of light emitted through the under surface of the first semiconductor layer 430 as a light emitting surface may be increased by the patterns 415 to improve light extraction efficiency of the light emitting device 400.

Each of the patterns 415 may have a convex lens shape and may be variously changed in shape to effectively emit light. For example, the pattern 415 may have a roughness shape.

The reflective layer 460 may be formed of at least one of silver (Ag), an alloy containing Ag, aluminum (Al), or an alloy containing Al, which has high reflective index.

The conductive support member 470 may be formed of at least one of Ti, Cr, Ni, Al, Pt, Au, W, Cu, and Mo, or may include a semiconductor substrate in which impurities are injected. The conductive support member 470 and the first electrode 480 provide power to the light emitting device 400.

Sixth Embodiment

Hereinafter, a light emitting device 500 and a method of manufacturing the same according to a sixth embodiment will be described in detail. In descriptions of the sixth embodiment, the same part as that of the first embodiment will be described with reference to the first embodiment, and their duplicated descriptions will be omitted.

Figure 13:
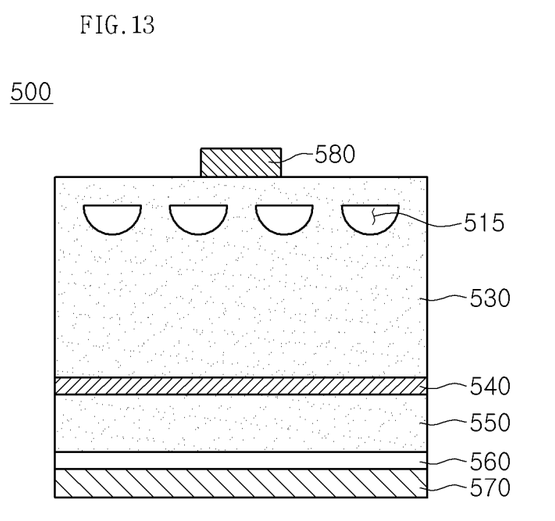
FIG. 13 is a sectional view of a light emitting device according to a sixth embodiment.

FIG. 13 is a sectional view of a light emitting device 500 according to a sixth embodiment.

Referring to FIG. 13, the light emitting device 500 according to the sixth embodiment includes a plurality of air-lenses 515, an active layer 540, a second conductive type semiconductor layer 550, a reflective layer 560, a conductive support member 570, and a first electrode 580. The light emitting device 500 may be defined as a vertical type light emitting device.

The light emitting device 500 does not include the patterns 415 of the fifth embodiment. Also, the plurality of air-lenses 515 may be disposed within the first semiconductor layer 530.

Each of the plurality of air-lenses 515 may have a convex lens shape and may be variously changed in shape to effectively emit light. For example, a roughness may be disposed on each of the plurality of air-lenses 515. Thus, light extraction efficiency of the light emitting device 500 may be improved by the plurality of air-lenses 515.

Also, since the plurality of air-lenses 515 is disposed within the first semiconductor layer 530 and serves as a resistor due to their low conductivity, current flowing between the first electrode 580 and the conductive support member 570 may be current-spread.

Figure 14:
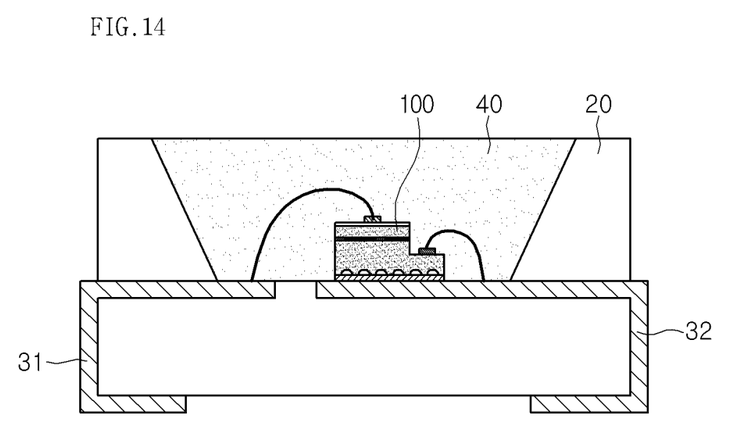
FIG. 14 is a sectional view of a light emitting device package including a light emitting device according to an embodiment.

FIG. 14 is a sectional view of a light emitting device including a light emitting device package according to an embodiment.

Referring to FIG. 14, a light emitting device package according to an embodiment includes a body part 20, first and second electrode layers 31 and 32 disposed on the body part 20, a light emitting device 100 disposed on the body part 20 and electrically connected to the first and second electrode layers 31 and 32, and a molding member 40 surrounding the light emitting device 100. Although the light emitting device package includes the light emitting device 100 according to the first embodiment in FIG. 14, the present disclosure is not limited thereto. For example, the light emitting device package may include the light emitting device according to other embodiments.

The body part 20 may be formed of a silicon material, a synthetic resin material, or a metal material. Also, an inclined surface may be disposed around the light emitting device 100.

The first and second electrode layers 31 and 32 are electrically separated from each other to supply power to the light emitting device 100. Also, the first and second electrode layers 31 and 32 may reflect light generated in the light emitting device 100 to increase light efficiency. In addition, the first and second electrode layers 31 and 32 may discharge heat generated in the light emitting device 100 to the outside.

The light emitting device 100 may be disposed on the body part 20 or first or second electrode layer 31 or 32. FIG. 14 exemplarily illustrates the light emitting device 100, which passes through the body part 20 and is disposed on the second electrode layer 32 extending into a cavity of the body part 20.

Although a wiring method in which the light emitting device 100 is electrically connected to the first and second electrode layers 31 and 32 through a wire is provided, the present disclosure is not limited thereto. For example, the light emitting device 100 may be electrically connected to the first and second electrode layers 31 and 32 through a flip chip method or a die bonding method.

The molding member 40 may surround the light emitting device 100 to protect the light emitting device 100. Also, a phosphor may be contained in the molding member 40 to change a wavelength of the light emitted from the light emitting device 100.

At least one light emitting device according to the above-described embodiments may be mounted on the light emitting device package in one or plurality, but is not limited thereto. The plurality of light emitting device packages according to an embodiment is arrayed on the substrate. Optical members such as a light guide plate, a prism sheet, a diffusion sheet, and a fluorescence sheet may be disposed on a path of the light emitted from the light emitting device packages. The light emitting device packages, the substrate, and the optical members may be functioned as a backlight unit or a lighting system. For example, a lighting system may include the backlight unit, the lighting unit, an indicating device, a lamp, and a street lamp.

Figure 15:
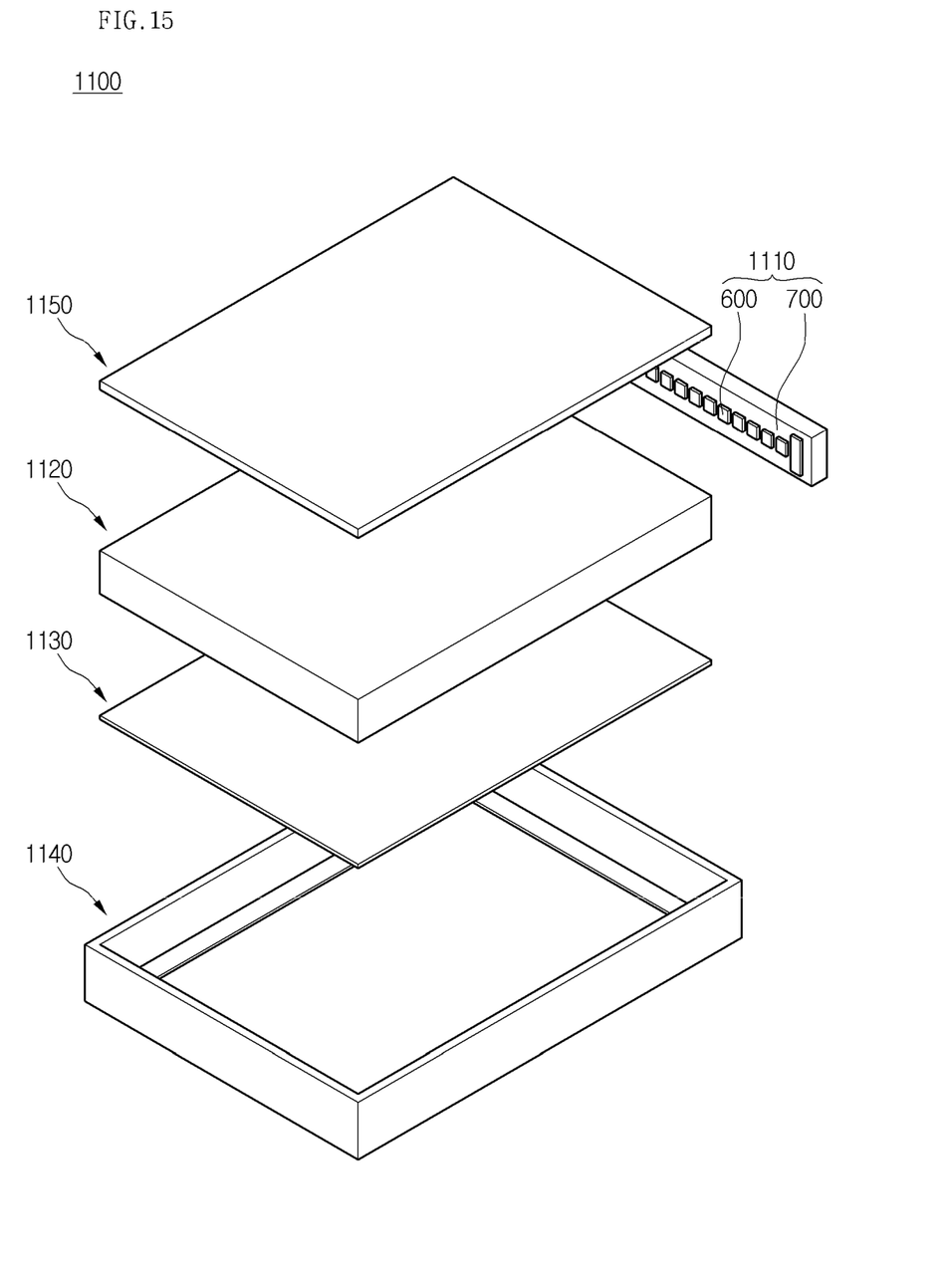
FIG. 15 is a view of a backlight unit including a light emitting device package according to an embodiment.

FIG. 15 is a view of a backlight unit 1100 including a light emitting device package according to an embodiment. However, the backlight unit 1100 of the FIG. 15 is an example of a lighting system, and the present disclosure is not limited thereto.

Referring to FIG. 15, the backlight unit 1100 may include a bottom cover 1140, a light guide member 1120 disposed within the bottom cover 1140, and a light emitting module 1110 disposed on at least one side or an under surface of the light guide member 1120. Also, a reflective sheet 1130 may be disposed below the light guide member 1120.

The bottom cover 1140 may have a box shape with an opened upper side to receive the light guide member 1120, the light emitting module 1110, and the reflective sheet 1130. The bottom cover 1140 may be formed of a metal material or a resin material, but is not limited thereto.

The light emitting module 1110 may include a substrate 700 and a plurality of light emitting device packages 600 mounted on the substrate 700. The plurality of light emitting device packages 600 may provide light to the light guide member 1120. Although the light emitting module 1110 in which the light emitting device package 600 is disposed on the substrate 700 is provided as an example in the present embodiment, the present disclosure is not limited thereto. For example, the light emitting device according to the embodiment may be directly disposed.

As shown in FIG. 15, the light emitting module 1110 may be disposed on at least one of inner surfaces of the bottom cover 1140. Thus, the light emitting module 1110 may provide light toward at least one lateral surface of the light guide member 1120.

The light emitting module 1110 may be disposed below the light guide member 1120 within the bottom cover 1140 to provide light toward an under surface of the light guide member 1120. This may be variously varied according to a design of the backlight unit 1100, and thus, the present disclosure is not limited thereto.

The light guide member 1120 may be disposed within the bottom cover 1140. The light guide member 1120 may receive the light provided from the light emitting module 1110 to produce planar light, thereby guiding the planar light to a display panel (not shown).

For example, the light guide member 1120 may be a light guide panel (LGP). The LGP may be formed of one of a resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed above the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet 1150. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. The fluorescence sheet may be a light transmitting plate or film including a phosphor.

The reflective sheet 1130 may be disposed below the light guide member 1120. The reflective sheet 1130 reflects the light emitted through the under surface of the light guide member 1120 toward a light emitting surface of the light guide member 1120.

The reflective sheet 1130 may be formed of a material having superior reflectance, e.g., a PET resin, a PC resin, or a PVC resin, but is not limited thereto.

Figure 16:
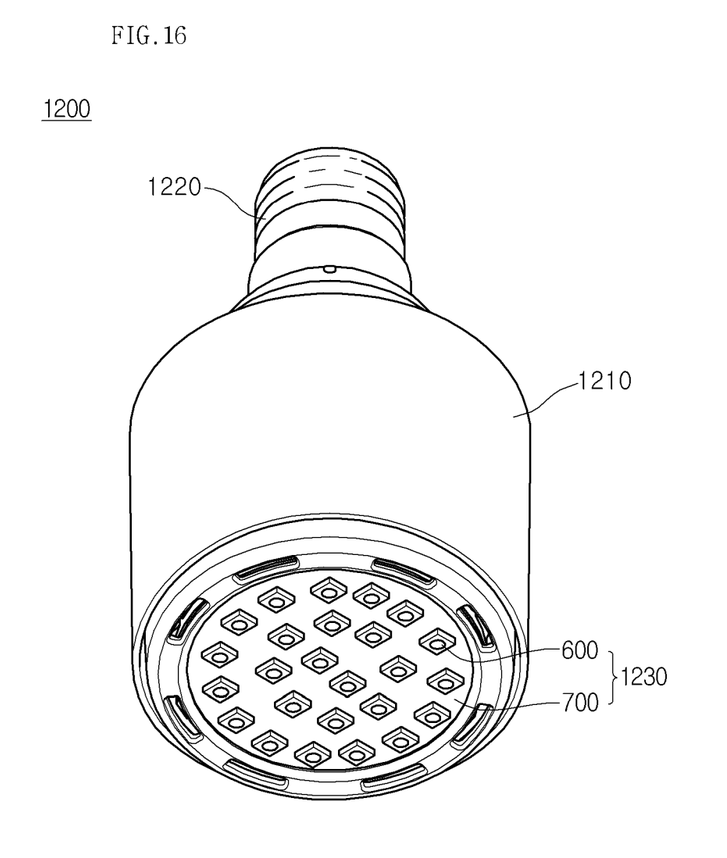
FIG. 16 is a view of a lighting unit including a light emitting device package according to an embodiment.

FIG. 16 is a view of a lighting unit including a light emitting device package according to an embodiment. However, the lighting unit 1200 of FIG. 16 is an example of a lighting system, and thus, the present disclosure is not limited thereto.

Referring to FIG. 16, the lighting system 1200 may include a case body 1210, a light emitting module 1230 disposed on the case body 1210, a connection terminal 1220 disposed on the case body 1210 to receive power from an external power source.

The case body 1210 may be formed of a material having good thermal dissipation properties, e.g., a metal material or a resin material.

The light emitting module 1230 may include a substrate 700 and at least one light emitting device package 600 mounted on the substrate 700. Although the light emitting module 1110 in which the light emitting device package 600 is disposed on the substrate 700 is provided as an example in the present embodiment, the present disclosure is not limited thereto. For example, the light emitting device 100 according to the embodiment may be directly disposed.

A circuit pattern may be printed on a dielectric to form the substrate 700. For example, the substrate 700 may include a printed circuit board (PCB), a metal core PCB, a flexible PCB, and a ceramic PCB.

Also, the substrate 700 may be formed of an effectively reflective material or have a color on which light is effectively reflected from a surface thereof, e.g., a white color or a silver color.

At least one light emitting device package 600 may be mounted on the substrate 700. The light emitting device package 600 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of the LED to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet changes a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. Referring to FIG. 16, the connected terminal 1220 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

As described above, in the lighting system, at least one of the light guide member, the diffusion sheet, the light collection sheet, the brightness enhancement sheet, and the fluorescence sheet may be disposed on the path of the light emitted from the light emitting module to obtain a desired optical effect.

Also, as described above, the lighting system according to the present disclosure includes the light emitting device having superior current spreading effect and superior thermal dissipation and light extraction efficiency or the light emitting device package. Therefore, the lighting system may have superior light properties.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
an undoped semiconductor layer on the substrate;
a first conductive type semiconductor layer on the undoped semiconductor layer, wherein the first conductive type semiconductor layer includes a first layer on the undoped semiconductor layer and a second layer on the first layer, wherein an upper surface of the first layer includes a first upper surface and a second upper surface and the second layer is disposed on the first upper surface of the first layer;
an active layer on the second layer of the first conductive type semiconductor layer;
a second conductive type semiconductor layer on the active layer; and
a plurality of vacant space parts disposed between the first upper surface of the first layer and the second layer,
wherein each of the plurality of vacant space parts has a thickness less than that of the second layer of the first semiconductor layer,
wherein a bottom surface of the second layer is contacted with the first upper surface of the first layer in between the plurality of vacant space parts, and
wherein the second upper surface of the first layer is exposed outside.

2. The light emitting device of claim 1, wherein each of the plurality of vacant space parts protrudes toward the active layer.

3. The light emitting device of claim 1, wherein a lower end of each of the plurality of vacant space parts is disposed on the first upper surface of the first layer.

4. The light emitting device of claim 1, wherein each of the plurality of vacant space parts has at least one of a convex lens shape, a hemisphere shape, a polygonal column shape, a polygonal pyramid shape, a cone shape, a truncated cone shape, and a polygonal cone shape.

5. The light emitting device of claim 1, wherein each of the plurality of vacant space parts has a roughness on a surface thereof.

6. The light emitting device of claim 1, wherein a plurality of roughness patterns are disposed on the substrate.

7. The light emitting device of claim 1, further comprising:
a first electrode electrically connected to the first conductive type semiconductor layer; and
a second electrode electrically connected to the second conductive type semiconductor layer.

8. The light emitting device of claim 1, wherein the plurality of vacant space parts is regularly arranged on the first upper surface of the first layer.

9. The light emitting device of claim 1, wherein air within the plurality of vacant space parts has a refractive index less than that of the first semiconductor layer.

10. A light emitting device package comprising:
a body part;
a first and a second electrode layers on the body part; and
a light emitting device disposed on the body part and electrically connected to the first and the second electrode layers,
wherein the light emitting device comprises:
a substrate;
an undoped semiconductor layer on the substrate;
a first conductive type semiconductor layer on the undoped semiconductor layer, wherein the first conductive type semiconductor layer includes a first layer on the undoped semiconductor layer and a second layer on the first layer, wherein an upper surface of the first layer includes a first upper surface and a second upper surface and the second layer is disposed on the first upper surface of the first layer;
an active layer on the second layer of the first conductive type semiconductor layer;
a second conductive type semiconductor layer on the active layer; and
a plurality of vacant space parts disposed between the first upper surface of the first layer and the second layer,
wherein each of the plurality of vacant space parts has a thickness less than that of the second layer of the first semiconductor layer,
wherein a bottom surface of the second layer is coplanar with the first upper surface of the first layer in between the plurality of vacant space parts, and
wherein the second upper surface of the first layer is exposed outside.

11. The light emitting device of claim 6, wherein each one of the plurality of roughness patterns is corresponding to each one of the plurality of vacant space parts.

12. The light emitting device package of claim 10, wherein each one of the plurality of vacant space parts protrudes toward the active layer.

13. The light emitting device package of claim 10, wherein a lower end of each one of the plurality of vacant space parts is disposed on the first upper surface of the first layer.

14. The light emitting device package of claim 10, wherein each of the plurality of vacant space parts has at least one of a convex lens shape, a hemisphere shape, a polygonal column shape, a polygonal pyramid shape, a cone shape, a truncated cone shape, and a polygonal cone shape.

15. The light emitting device package of claim 10, wherein each of the plurality of vacant space parts has a roughness on a surface thereof.

16. The light emitting device package of claim 10, wherein roughness patterns are disposed on the substrate.

17. The light emitting device package of claim 10, wherein the plurality of vacant space parts is regularly arranged on the first upper surface of the first layer.

18. The light emitting device package of claim 10, wherein air within the plurality of vacant space parts has a refractive index less than that of the first semiconductor layer.

19. The light emitting device of claim 1, wherein a height of the plurality of vacant space parts is higher than that of the second upper surface of the first layer.

20. The light emitting device package of claim 10, wherein a height of the plurality of vacant space parts is higher than that of the second upper surface of the first layer.

* * * * *